(12) United States Patent
Altmann (10) Patent No.: US 6,764,891 B2
(45) Date of Patent: Jul. 20, 2004

(54) PHYSICALLY DEFINED VARACTOR IN A CMOS PROCESS

(75) Inventor: Michael W. Altmann, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 160 days.

(21) Appl. No.: 10/085,255

(22) Filed: Feb. 26, 2002

(65) Prior Publication Data
US 2003/0162343 A1 Aug. 28, 2003

(51) Int. Cl.[7] .................................... H01L 21/8238
(52) U.S. Cl. ......................................... 438/200
(58) Field of Search .................... 438/156, 199, 438/200, 222, 357, 527; 257/302, 596; 365/170

(56) References Cited

U.S. PATENT DOCUMENTS 4,753,898 A * 6/1988 Parrillo et al. ............. 438/231

OTHER PUBLICATIONS

Altmann, M. et al.; A Low–Power CMOS 155Mb/s Transceiver for SONET/SDH over Co–ax & Fibre; 2001 Custom Integrated Circuits Conference; 4 pages.

* cited by examiner

Primary Examiner—David A. Zarneke
Assistant Examiner—Monica D. Harrison
(74) Attorney, Agent, or Firm—Blakely, Sokoloff, Taylor & Zafman LLP (57) ABSTRACT

A differential varactor is physically defined in a CMOS process using a using the diffusion mask of a polycide gate rather than a P (+) mask, as is commonly used. The differential CMOS varactor may be used in a a phase locked loop (PLL) of a voltage-controlled oscillator (VCO) to enable a transceiver to communicate at OC-3/STM-1 data rates using SONET/SDH signaling formats.

7 Claims, 5 Drawing Sheets

PHYSICALLY DEFINED VARACTOR IN A CMOS PROCESS

BACKGROUND OF THE INVENTION

1. Field of the Invention

The present invention is related to integrated circuits and, in particular, to a variable capacitor in complementary metal oxide semiconductor (CMOS) process.

2. Background Information

Data access rates for Synchronous Optical Network (SONET) and Synchronous Digital Hierarchy (SDH) networks are steadily increasing as demand for web content move toward video-on-demand, streaming video, and audio, and teleconferencing applications. The current trend is to provide such high bandwidth access over coaxial cables and optical fibers has using SONET and SDH signaling formats. SONET specifies a set of transmission speeds (or data rates), which are multiples of the optical carrier level one (OC-1) channel data rate of 51.840 megabits per second (Mbps). For example, it is common to provide access at Optical Carrier level three/Synchronous Transfer Module 1 (OC-3)/(STM-1) rate, which is a data rate of 155.52 megabits per second (Mbps).

To accomplish data access at such data rates, the SONET/SDH standards demand components that have high levels of integrations, low power consumption, and low jitter. Jitter is commonly defined as short-term variations of a digital signal's significant instants from their ideal positions in time. Jitter tolerance is the peak-to-peak amplitude of sinusoidal jitter applied at the line interface input that causes an equivalent 1 dB signal-to-noise ratio (SNR) loss measured as bit error rate (BER)=$10^{-10}$. The stringent SONET specify that the jitter gain by optical transceivers on an OC-3 channel (155.52 Mbps) be less than 0.1 dB and that the output jitter (e.g., jitter generation, intrinsic jitter) be less than 0.1UI peak-to-peak or 0.01UI rms Such demanding standards may be difficult to achieve with current transceivers implemented in complementary metal oxide semiconductor (CMOS) technology. To explain, an oscillator with a low jitter gain is usually an inductor-capacitor tank voltage controlled oscillator (LC tank VCO).

What limits the noise in an LC tank is its small quality factor (Q), which is a measure of the LC tank's frequency response (i.e., it's noise bandwidth). A degraded Q causes the center frequency of the LC tank to shift and it'ts output jitter to increase, as is well known. The Q of an LC tank is given by:

$$Q = \omega L / R_{\mathit{eff}} = 1/(\omega C_{eq})(R_{\mathit{eff}}) \quad \text{(Equation 1)}$$

where $\omega$ is the angular frequency of the signal through the capacitor and inductor, $C_{eq}$ is the equivalent capacitance in farads, L is the value of the inductor in henrys, and $R_{\mathit{eff}}$ is the equivalent resistance (or resistivity) of the circuit.

To obtain a high Q, the inductance (L) may be increased, the capacitance (C) may be decreased, and the effective resistance ($R_{\mathit{eff}}$) may be decreased. It is not anticipated the any technological advances will improve inductance-related Q. Therefore, to improve LC tank Q, the capacitance-related Q may be matched to the L-related Q using a voltage-controlled capacitor (or varactor). In low frequency applications, the inductor Q is typically around four or five. Prior art CMOS voltage controlled capacitors have similar Qs in low frequency applications (e.g., around five or six). In high frequency applications, the inductor Q can be as high as twenty or thirty. Unfortunately, prior art CMOS voltage controlled capacitors do not have comparable Qs because of relatively large parasitic resistance ($R_{\mathit{eff}}$). In many instances, the Q of the LC tank is so degraded that it may be unusable in SONET or other high-speed environments having demanding jitter performance standards because the parasitic resistance is a source of noise, which reduces jitter performance.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

A CMOS varactor according to embodiments of the present invention is described herein. In the following description, numerous specific details, such as particular processes, materials, devices, and so forth, are presented to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring various embodiments of the invention.

Some parts of the description will be presented using terms such as transceiver, phase-locked loop, substrate, resistance, capacitance, jitter, and so forth. These terms are commonly employed by those skilled in the art to convey the substance of their work to others skilled in the art.

Other parts of the description will be presented in terms of operations performed by a computer system, using terms such as accessing, determining, counting, transmitting, and so forth. As is well understood by those skilled in the art, these quantities and operations take the form of electrical, magnetic, or optical signals capable of being stored, transferred, combined, and otherwise manipulated through mechanical and electrical components of a computer system; and the term "computer system" includes general purpose as well as special purpose data processing machines, systems, and the like, that are standalone, adjunct or embedded.

Various operations will be described as multiple discrete blocks performed in turn in a manner that is most helpful in understanding the invention. However, the order in which they are described should not be construed to imply that these operations are necessarily order dependent or that the operations be performed in the order in which the blocks are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
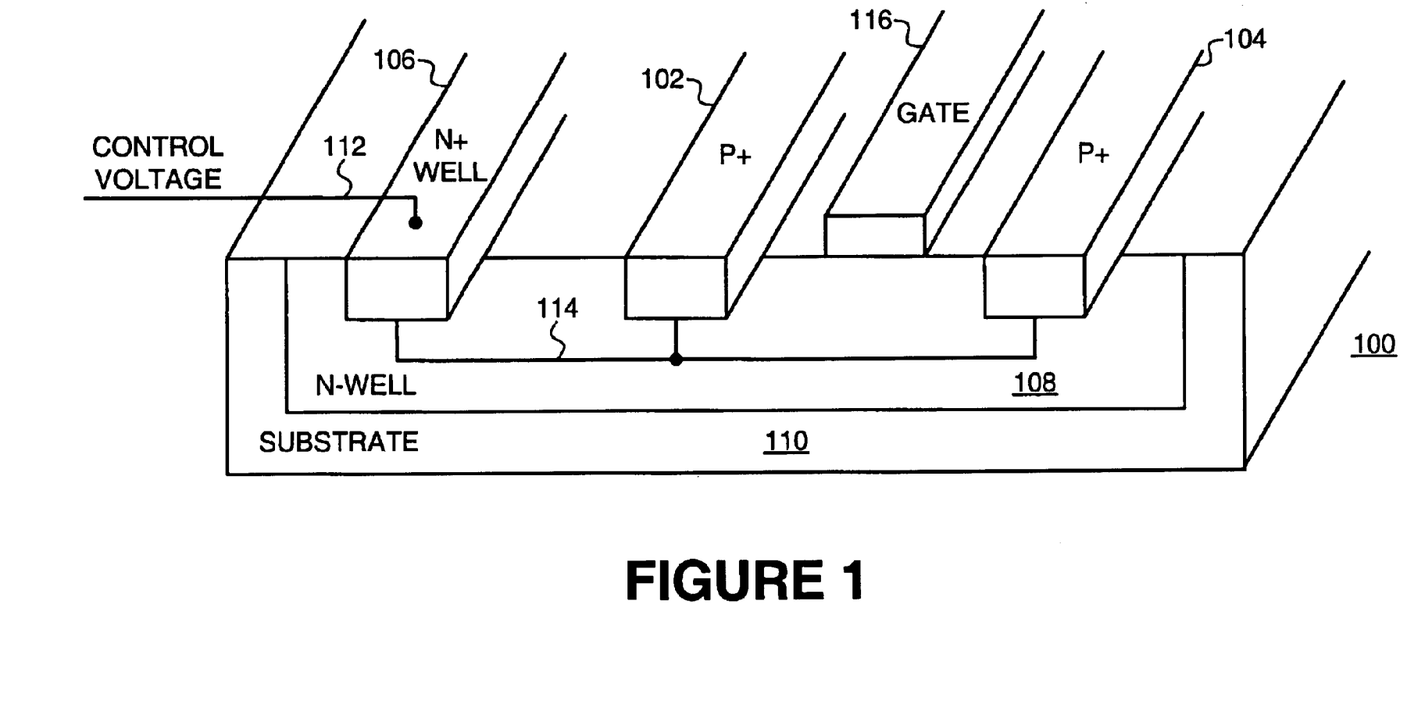
FIG. 1 is a perspective view of a fragment of a CMOS differential varactor 100 according to embodiments of the present invention.

FIG. 1 is a perspective view of a fragment of a CMOS differential varactor 100 according to embodiments of the present invention. In one embodiment of the present invention, the varactor 100 may be a P-N junction diode formed from source-drain diffusions of a p-type metal oxide semiconductor field effect transistor (p-MOSFET) within an n-well.

For example, the varactor 100 includes a P-N diode formed using two rectangular diffusions of P (+) material (102, 104) inside an n-well 108. An N (+) well contact 106 is formed inside the n-well 108. The n-well 108 is formed in a (p) substrate 110 (e.g., epitaxial substrate, non-epitaxial substrate, silicon-on-insulator (SOI) substrate, silicon-on sapphire (SOP) substrate). The N (+) well contact 106 is electrically connected (electrical connection 114) to the two P (+) diffusions 102, 104. A control voltage 112 is applied to move the N (+) well contact 106 up and down inside the n-well 108 to vary the depletion regions between each P (+) diffusions (102, 104) and the n-well 108, which changes the capacitance between each of the two P (+) diffusions 102, 104 and the n-well 108.

Because the two P (+) diffusions 102, 104 are operated like a differential capacitance in that when the voltage on the P (+) material 102 is increasing, the voltage on the P (+) material 104 is decreasing, and vice versa, the closer the two rectangular diffusions of P (+) material (102, 104) are to each other, the better the coupling between them. The diffusion masks commonly used to locate the two rectangular diffusions of P (+) material (102, 104) typically allow spacing between the two rectangular diffusions of P (+) material (102, 104) no less than approximately 0.5 microns, however.

Figure 2:
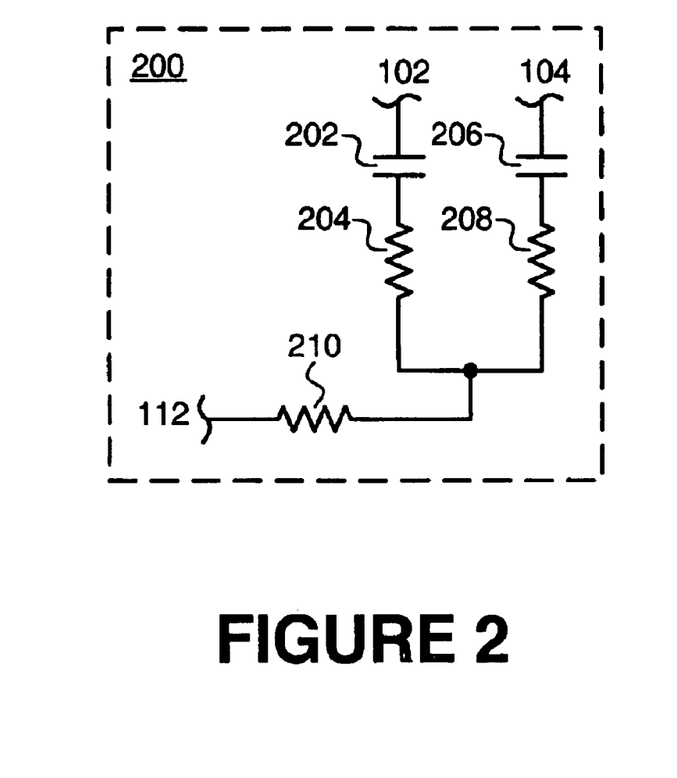
FIG. 2 is a schematic diagram of an equivalent circuit 200 of a portion of the CMOS varactor 100 having spacing between the two rectangular diffusions of P(+) material (102, 104) no less than approximately 0.5 microns.

To illustrate, FIG. 2 is a schematic diagram of an equivalent circuit 200 of a portion of the CMOS varactor 100 as described so far (i.e. having a spacing between the two rectangular diffusions of P(+) material (102, 104) no less than approximately 0.5 microns). The equivalent circuit 200 shows a capacitance 202 and a resistance 204 coupled in series with the P (+) material 102, and a capacitance 206 and a resistance 208 coupled in series with the P (+) material 104. Both legs (i.e., capacitance 202/resistance 204 and capacitance 206/resistance 208) are coupled in parallel with a series resistance 210 to N (+) well contact 106.

The series resistances 208 and 208 are parasitic resistances, however, and reduce the Q of the differential capacitance created by the two P (+) diffusions 102, 104. As the Q of the differential capacitance created by the two P (+) diffusions 102, 104 degrades, the jitter in any LC tank using the varactor 100 increases. The resistance 210 has a negligible effect on the Q. The closer the two rectangular diffusions of P (+) material 102, 104 are to each other, the smaller the resistances 204 and 208 become. However, as described above, current diffusion masks limit the spacing between the two rectangular diffusions of P (+) material 102, 104.

According to an embodiment of the present invention, the spacing between the two rectangular diffusions of P (+) material 102, 104 is reduced by using the diffusion mask of a polycide gate 116 rather than a P (+) mask, as is commonly used. For example, the spacing between the two rectangular diffusions of P (+) material 102, 104 may be reduced to less than approximately 0.3 microns using a 0.35-micron CMOS process. As such, the resistances from the two diffusions of P (+) material 102, 104 back to the N (+) well contact 106 is reduced such that it becomes negligible, something not possible with conventional diffusion masking techniques.

Figure 3:
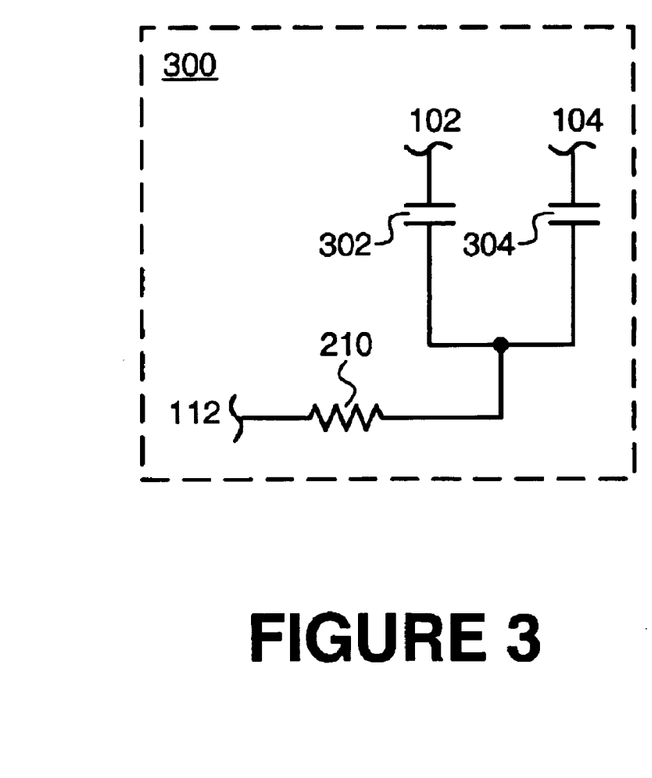
FIG. 3 is a schematic diagram of an equivalent circuit 300 of a portion of the CMOS varactor 100 according to an embodiment of the present invention.

To illustrate, FIG. 3 is a schematic diagram of an equivalent circuit 300 of a portion of the CMOS varactor 100 according to an embodiment of the present invention (e.g., including the gate 116). The equivalent circuit 300 shows a capacitance 302 and a resistance 304 coupled in series with the P (+) material 102 and the P (+) material 104, respectively. Both the capacitance 302 and the capacitance 304 are coupled to the series resistance 210 to N (+) well contact 106. Note that the parasitic resistances are negligible.

Although embodiments of the present invention are described with respect to a varactor formed from the source-drain diffusions of a p-MOSFET (e.g., the two P (+) diffusions (102, 104)) formed within an n-well (e.g., the n-well 108), embodiments of the present invention also apply to an n-MOSFET formed within a P (+well).

In alternative embodiments of the present invention, the spacing between the two rectangular diffusions of P (+) material 102, 104 may be further reduced by using lightly-doped drain (LDD) structures, using halo implant, and/or using LDD with halo implant. Such uses may cause the two rectangular diffusions of P (+) material 102, 104 to extend under the gate 116 edges.

Figure 4:
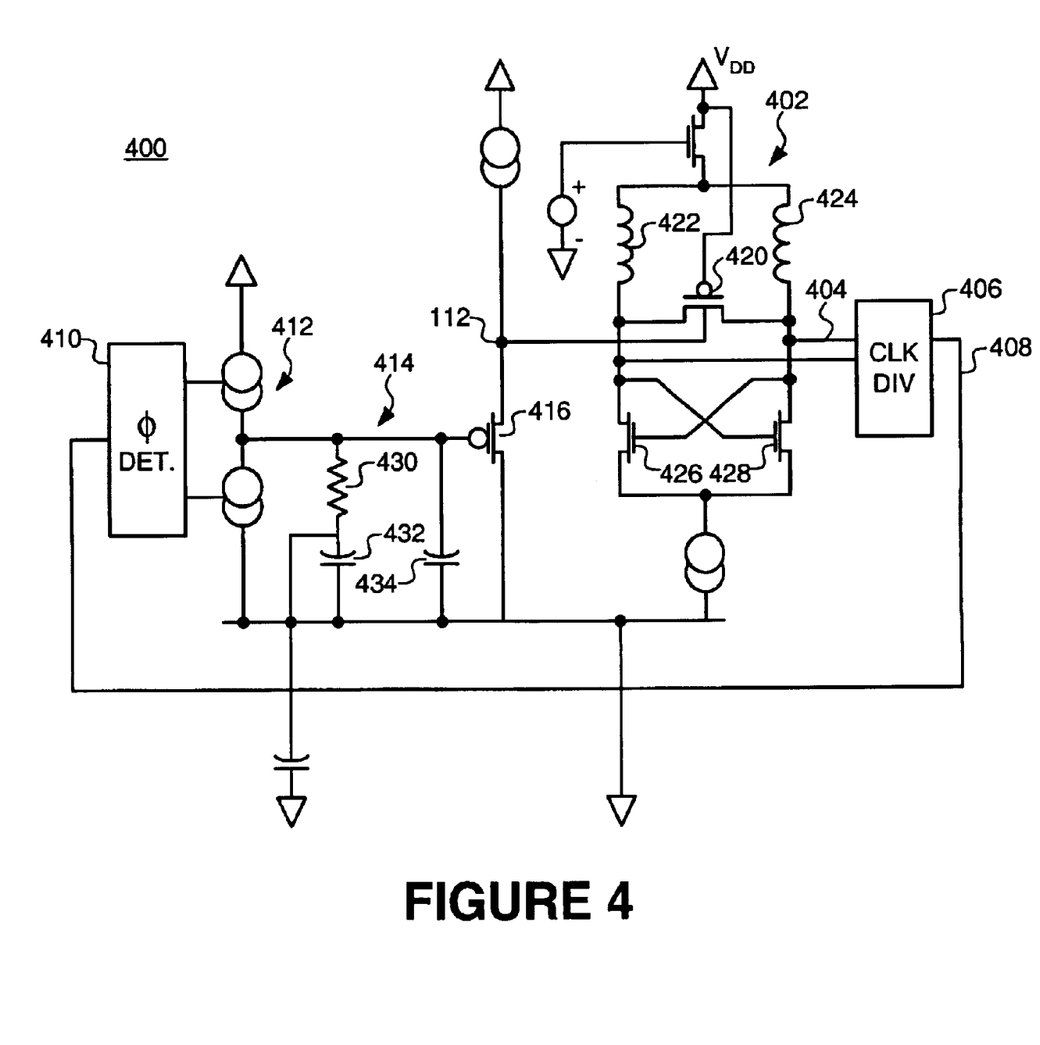
FIG. 4 is a high-level block diagram of CMOS transceiver according to embodiments of the present invention.

FIG. 4 is a schematic block diagram of a phase-locked loop 400 according to embodiments of the present invention. The phase-locked loop 400 includes a voltage-controlled oscillator (VCO) core 402, which outputs clock pulses 404 to an optional clock divider 406. In embodiments of the present invention having a clock divider, the clock divider 406 may divide the clock pulses 404 to lower frequency clock pulses 408, which are input to a phase detector 410. Alternatively, the division ratio may be "one" and the phase-locked loop 400 has no clock divider. The phase detector 410 drives a charge pump 412, which drives a loop filter 414. The loop filter 414 drives a buffer 416, which drives the voltage-controlled oscillator core 402 to output the clock pulses 404.

The VCO core 402 includes a CMOS varactor 420, which is represented by a p-MOSFET whose gate (116) is coupled $V_{DD}$ and whose substrate (110) is coupled to the control voltage 112 (e.g., as supplied by the phase detector 410 through the buffer 416). The CMOS varactor 420 may be any CMOS varactor implemented according to embodiments of the present invention.

The VCO core 420 also includes a pair of inductors 422, 424, which may be formed in the same substrate (110) as CMOS varactor 420. Inductors suitable for implementing the pair of inductors 422, 424 are well known. The VCO core 420 also includes a pair of n-MOSFETS 426, 428. MOSFETS suitable for implementing the n-MOSFETS 426, 428 are well known.

According to an embodiment of the present invention, the voltage-controlled oscillator core 402 may be running at greater than one GHz and can be running at approximately 1.25 GHz.

Dividers suitable for implementing the clock divider 406 are well known.

Phase detectors suitable for implementing the phase detector 410 are well known.

Charge pumps suitable for implementing the charge pump 412 are well known.

The loop filter 414 includes a resistor 430 and a pair of capacitors 432, 434. Resistors and capacitors suitable for implementing the loop filter 414 are well known.

Figure 5:
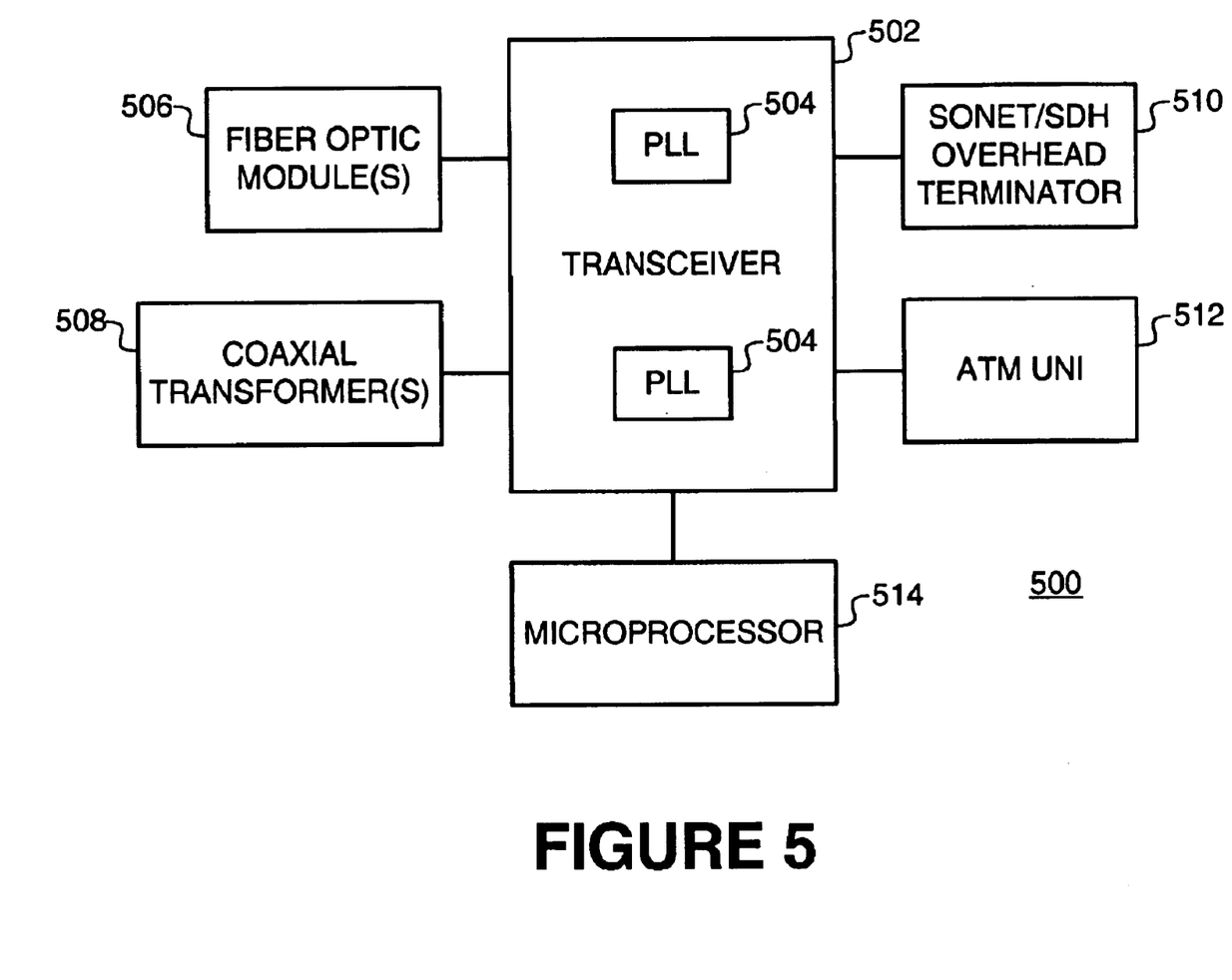
FIG. 5 is a high-level block diagram of a communications system according to embodiments of the present invention.

FIG. 5 is a high-level block diagram of a communications system 500 according to embodiments of the present invention. The system 500 includes a transceiver 502, which may be a front-end transceiver suitable for 155 Mbps OC3/STM1/Asynchronous Transfer Mode (ATM) transmission applications. The example transceiver 502 includes a pair of phase-locked loops 504 implemented according to embodiments of the present invention.

The example transceiver 502 interfaces to one or more well-known or future fiber optic modules 506 and/or coaxial transformers 508 on the line side, and to a well-known or future SONET/SDH overhead terminator 510 or a well-known or future ATM User Network Interface (UNI) 512 on the system side. The example transceiver 502 may include a well-known or future microprocessor 514, which may provide software-mode control of the transceiver 502 in any suitable manner.

The system 500 and other devices implemented according to embodiments of the present invention may be suitable for use as/in optical cross-connects (OXC), optical add/drop multiplexers (OADM) that operate at the optical carrier level 3 (OC-3), short haul serial links, access links for Asynchronous Transfer Mode (ATM) wide area networks (WAN), digital loop carriers which has a data rate of approximately 155.52 Mbps. Alternative embodiments of the present invention may be suitable for use as/in optical cross-connects (OXC) and/or optical add/drop multiplexers (OADM) that operate at OC-768, which has a data rate of 39.81312 Gbps. Of course, other SONET/SDH data rates are suitable including 155 Mbps, 622 Mbps, 2.488 Gbps, 9.953 Gbps, and 39.8 Gbps)

Figure 6:
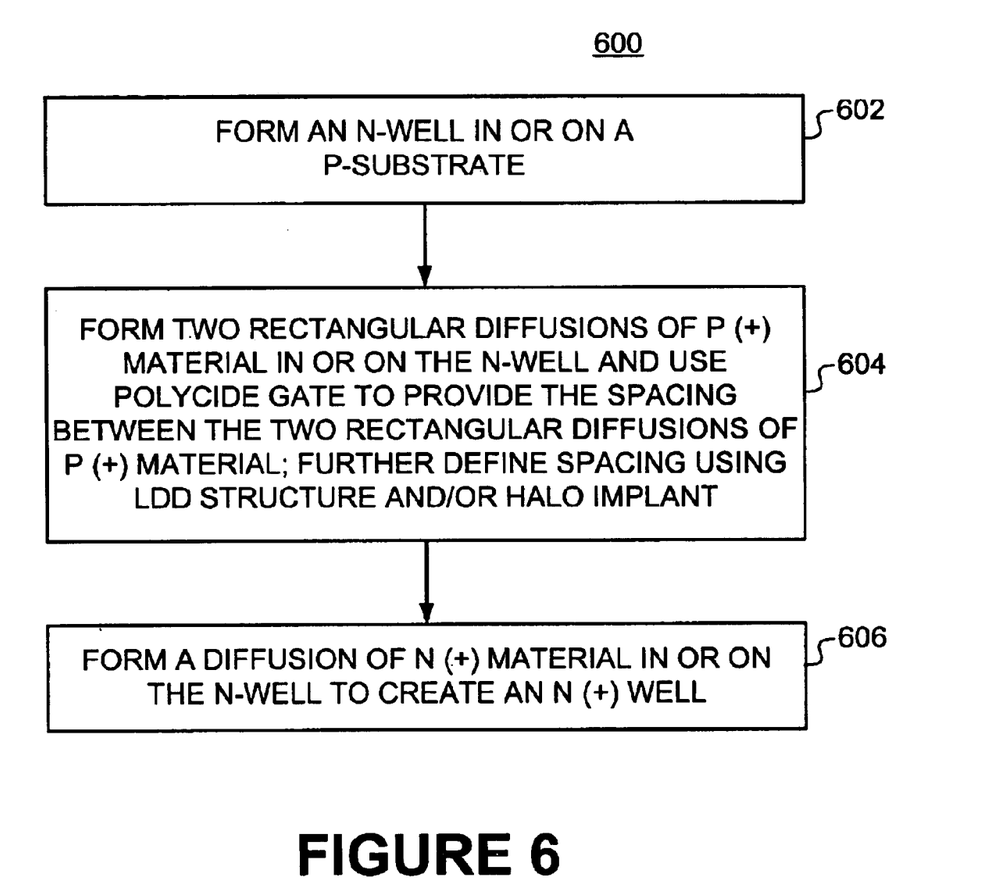
FIG. 6 is a flowchart of a fabrication process to fabricate a CMOS varactor according to embodiments of the present invention.

FIG. 6 is a flowchart of a fabrication process 600 to fabricate a CMOS varactor according to embodiments of the present invention. A machine-readable medium having machine-readable instructions thereon may be used to cause a processor to perform the process 600. Of course, the process 600 is only an example process and other processes may be used.

In a block 602, an n-well is formed in or on a p-substrate using well-known or future techniques. According to embodiments of the present invention, the n-well is diffused into the p-substrate using well-known or future diffusion techniques.

In a block 604, two rectangular diffusions of P (+) material are formed in or on the n-well and a polycide gate is used to provide the spacing between the two rectangular diffusions of P (+) material. A polycide gate mask may be used to define the spacing between the two rectangular diffusions of P (+) material. An LDD structure, a halo implant, and/or an LDD with a halo implant may further define the spacing between the two rectangular diffusions of P (+) material. Although halo implants are commonly used to, among other things control leakage currents, in embodiments of the present invention, however, the halo implants are used to define the spacing between the two rectangular diffusions of P (+) material.

According to embodiments, a metal oxide structure is built on top of the n-well diffusion and the two rectangular diffusions of P (+) material are laid out (e.g., etched) as a P-N diode using well-known or future techniques. In one embodiment of the present invention, a layer of metal oxide is deposited using well known or proprietary plasma enhanced chemical vapor deposition (PECVD) techniques, for example. In other embodiments of the present invention, forms a semiconductor diode on the SOI substrate. According to embodiments of the present invention, the P-N diode is formed by doping portions of the n-well with P-type material in a well-known manner using ion implantation, diffusion from spin-on solutions, or other current or future techniques In a block 606, a diffusion of N (+) material is formed in or on the n-well to create an N (+) well. According to embodiments, N (+) material is diffused into the n-well using well-known or future techniques.

Although embodiments of the present invention are described with respect to a voltage variable capacitor in an LC-type resonator circuit, embodiments of the present invention are not so limited. For example, embodiments of the present invention may include self-balancing bridge circuits, parametric amplifiers, filters, or other suitable circuits.

Embodiments of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
    disposing two rectangular diffusions of P (+) material in an n-well formed in a p-substrate using a complementary metal oxide semiconductor (CMOS) process;
    disposing a polycide gate between the two rectangular diffusions of P (+) material;
    disposing a pair of inductors on the substrate; and
    coupling the two rectangular diffusions of P (+) material and the pair of inductors in a voltage-controlled oscillator (VCO) configuration.

2. The method of claim 1 wherein disposing two rectangular diffusions of P (+) material in an n-well formed in a p-substrate using the CMOS process comprises disposing two rectangular diffusions of P (+) material in an n-well formed in an epitaxial substrate using the CMOS process.

3. The method of claim 1 wherein disposing two rectangular diffusions of P (+) material in an n-well formed in a p-substrate using the CMOS process comprises disposing two rectangular diffusions of P (+) material in an n-well formed in a non-epitaxial substrate using the CMOS process.

4. The method of claim 3 wherein disposing two rectangular diffusions of P (+) material in an n-well formed in a p-substrate using the CMOS process comprises disposing two rectangular diffusions of P (+) material in an n-well diffused in a p-substrate using the CMOS process.

5. The method of claim 1 wherein disposing two rectangular diffusions of P (+) material in an n-well formed in a p-substrate using the CMOS process comprises building a metal oxide structure on top of the n-well.

6. The method of claim 1 further comprising defining the spacing between the two rectangular diffusions of P (+) material using a lightly doped drain (LDD) structure.

7. The method of claim 1 further comprising defining the spacing between the two rectangular diffusions of P (+) material using halo implantation.

* * * * *

UNITED STATES PATENT AND TRADEMARK OFFICE
CERTIFICATE OF CORRECTION

PATENT NO. : 6,764,891 B2
DATED : July 20, 2004
INVENTOR(S) : Altmann

It is certified that error appears in the above-identified patent and that said Letters Patent is hereby corrected as shown below:

Column 4,
Line 29, delete "P (+well)" and insert -- P (+) well --.

Signed and Sealed this

Thirtieth Day of November, 2004

JON W. DUDAS
*Director of the United States Patent and Trademark Office*